(12) United States Patent
Guo

(10) Patent No.: US 11,189,326 B1
(45) Date of Patent: Nov. 30, 2021

(54) NON-DESTRUCTIVE MODE CACHE PROGRAMMING IN NAND FLASH MEMORY DEVICES

(71) Applicant: Yangtze Memory Technologies Co., Ltd., Hubei (CN)

(72) Inventor: Jason Guo, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 0 days.

(21) Appl. No.: 17/062,228

(22) Filed: Oct. 2, 2020

Related U.S. Application Data

(63) Continuation of application No. PCT/CN2020/111690, filed on Aug. 27, 2020.

(51) Int. Cl.
 *G11C 8/00* (2006.01)
 *G11C 7/10* (2006.01)
 *G11C 7/14* (2006.01)

(52) U.S. Cl.
 CPC .......... *G11C 7/1021* (2013.01); *G11C 7/106* (2013.01); *G11C 7/1057* (2013.01); *G11C 7/1084* (2013.01); *G11C 7/1087* (2013.01); *G11C 7/14* (2013.01)

(58) Field of Classification Search
 CPC .................................................. G11C 7/1057
 USPC .................................................. 365/238.5
 See application file for complete search history.

(56) References Cited

U.S. PATENT DOCUMENTS

| 2016/0005490 | A1 | 1/2016 | Shim |
| 2016/0055919 | A1 | 2/2016 | Park et al. |
| 2019/0317691 | A1 | 10/2019 | Kanno |
| 2021/0090638 | A1* | 3/2021 | Hung .................... G11C 29/789 |

FOREIGN PATENT DOCUMENTS

CN 112204536 A 1/2021

OTHER PUBLICATIONS

International Search Report of the International Searching Authority directed to related International Patent Application No. PCT/CN2020/111690, dated May 27, 2021; 4 pages.

* cited by examiner

*Primary Examiner* — Hoai V Ho
(74) *Attorney, Agent, or Firm* — Sterne, Kessler, Goldstein & Fox P.L.L.C.

(57) ABSTRACT

A method of cache programming of a NAND flash memory in a triple-level-cell (TLC) mode is provided. The method includes discarding an upper page of a first programming data from a first set of data latches in a plurality of page buffers when a first group of logic states are programmed and verified. The plurality of page buffers include the first, second and third sets of data latches, configured to store the upper page, middle page and lower page of programming data, respectively. The method also includes uploading a lower page of second programming data to a set of cache latches, transferring the lower page of the second programming data from the set of cache latches to the third set of data latches after discarding the lower page of the first programming data, and uploading a middle page of the second programming data to the set of cache latches.

20 Claims, 15 Drawing Sheets

|             | ER | P1 | P2 | P3 | P4 | P5 | P6 | P7 |
|-------------|----|----|----|----|----|----|----|----|
| lower page  | 1  | 0  | 1  | 0  | 0  | 1  | 1  | 0  |
| middle page | 1  | 0  | 0  | 1  | 0  | 1  | 0  | 1  |
| upper page  | 1  | 0  | 0  | 0  | 1  | 0  | 1  | 1  |

Fig. 4

| Latches in the Page Buffer | Data Stored in the Latches |
|---|---|
| Latch D1 | Lower page |
| Latch D2 | Middle page |
| Latch D3 | Upper page |
| Latch SL | 3 bit line information |
| Latch SA | Sensing latch |
| Cache Latch CA | Inhibit information |

Fig. 6

| Latches in the Page Buffer | Data Stored in the Latches |
|---|---|
| Latch D1 | Lower page |
| Latch D2 | Middle page |
| Latch D3 | Inhibit information |
| Latch SL | 3 bit line information |
| Latch SA | Sensing latch |
| Cache Latch CA | New lower page |

Fig. 9

| | ER | P1 | P2 | P3 | P4 | P5 | P6 | P7 |
|---|---|---|---|---|---|---|---|---|
| lower page (D1) | x | x | x | x | x | x | x | x |
| middle page (D2) | 1 | 0 | 0 | 1 | 0 | 1 | 0 | 1 |
| upper page (D3) | x | x | x | x | x | x | x | x |
| recovered D1/D3 after reading using $V_{R2}$ | 1/1 | 0/0 | x | x | x | x | x | x |
| recovered D1/D3 after reading using $V_{R4}$ | 1/1 | 0/0 | 1/0 | 0/0 | x | x | x | x |
| recovered D1/D3 after reading using $V_{R6}$ | 1/1 | 0/0 | 1/0 | 0/0 | 0/1 | 1/0 | 1/1 | 0/1 |
| Recovered lower page | 1 | 0 | 1 | 0 | 0 | 1 | 1 | 0 |
| Recovered upper page | 1 | 0 | 0 | 0 | 1 | 0 | 1 | 1 |

Fig. 12

| Latches in the Page Buffer | Data Stored in the Latches |
|---|---|
| Latch D1 | New lower page |
| Latch D2 | Middle page |
| Latch D3 | Inhibit information |
| Latch SL | 3 bit line information |
| Latch SA | Sensing latch |
| Cache Latch CA | New middle page |

Fig. 13

| Latches in the Page Buffer | Data Stored in the Latches |
|---|---|
| Latch D1 | New lower page |
| Latch D2 | Middle page |
| Latch D3 | Inhibit information |
| Latch SL | New middle page |
| Latch SA | Sensing latch |
| Cache Latch CA | New upper page |

Fig. 15

NON-DESTRUCTIVE MODE CACHE PROGRAMMING IN NAND FLASH MEMORY DEVICES

CROSS-REFERENCE TO RELATED APPLICATIONS AND INCORPORATION BY REFERENCE

This application claims priority to PCT/CN2020/111690 filed on Aug. 27, 2020, which is incorporated herein by reference in its entirety.

TECHNICAL FIELD

The present disclosure generally relates to the field of semiconductor technology, and more particularly, to a method for cache programming in a NAND flash memory.

BACKGROUND

In many servers and mobile devices, NAND flash memory is widely used as the primary non-volatile storage device due to its high storage density and relatively low access latency. To reduce cost and improve programming speed, programming data are usually not stored in the host computer after sent to the NAND flash memory. To prevent data loss in event of programming failure, a NAND flash memory typically stores the original programming data in the page buffers throughout the entire write operation, where the original programming data can be recovered in case of programming failure.

To increase storage capacity, in a state-of-art NAND flash memory, each memory cell can store multiple bits. Programming and verifying each memory cell is therefore prolonged. Currently, new programming data are sent to the page buffer after the previous programming operation is completed and the programming data stored in the memory cells are verified. In a high speed storage system, the data-in time in the page buffer can limit the overall system write performance. Therefore, it is necessary to optimize cache programming.

BRIEF SUMMARY

The object of the present disclosure is to improve the cache programming in the page buffers, i.e., reducing the data-in time, without losing the original programming data in a non-destructive mode.

Embodiments of methods for cache programming in a NAND flash memory device are described in the present disclosure.

One aspect of the present disclosure provides a method of cache programming of a NAND flash memory. The method includes discarding a first logic page of first programming data from a first set of data latches in a plurality of page buffers of the NAND flash memory when a first group of logic states are programmed and verified for a plurality of memory cells in a memory page of the NAND flash memory. Each of the plurality of memory cells comprises 2n logic states. Each of the plurality of memory cells is coupled to at least one of the plurality of page buffers. The plurality of page buffers comprises n set of data latches configured to store n logic pages of programming data. The method also includes uploading a second logic page of second programming data to a set of cache latches in the plurality of page buffers.

In some embodiments, the method also includes transferring inhibit information from the set of cache latches to the first set of data latches after the discarding the first logic page. The method further includes inhibiting the plurality of memory cells from further programming when the inhibit information comprises logic "1."

In some embodiments, the method also includes, prior to discarding the first logic page, programming the first group of logic states for the plurality of memory cells, wherein the first group of logic states comprise a first group of threshold voltages lower than a second group of threshold voltages of a second group of logic states of the plurality of memory cells. The method further includes programming the plurality of memory cells to the second group of logic states according to remaining logic pages of the first programming data.

In some embodiments, the method also includes verifying each of the $2^n$ logic states of the plurality of memory cells by using a plurality of read reference voltages, each read reference voltage comprising a magnitude between threshold voltages of two adjacent logic states.

In some embodiments, the method also includes programming the plurality of memory cells from a first logic state with a lowest threshold voltage to an nth logic state with a highest threshold voltage.

In some embodiments, the method also includes recovering the first logic page of the first programming data when a programming failure occurs. The method further includes reading the plurality of memory cells by using a first read reference voltage, wherein the first read reference voltage separates the $2^n$ logic states into two distinguishable groups. The method also includes constructing binary codes for the first logic page based on remaining logic pages and the two distinguishable groups.

Another aspect of the present disclosure provides a method of cache programming of a NAND flash memory in a triple-level-cell (TLC) mode. The method includes discarding an upper page of a first programming data from a first set of data latches in a plurality of page buffers of the NAND flash memory when a first group of logic states are programmed and verified for a plurality of memory cells in a memory page of the NAND flash memory. Each of the plurality of memory cells has 8 logic states. The 8 logic states can be an erased state and ith logic states, wherein i=1 to 7 and threshold voltages of the 8 logic states are in an ascending order. Each of the plurality of memory cells is coupled to at least one of the plurality of page buffers. The plurality of page buffers comprises the first set of data latches, a second set of data latches and a third set of data latches, configured to store the upper page, a middle page and a lower page of programming data, respectively. The method further includes uploading a lower page of second programming data to a set of cache latches in the plurality of page buffers.

In some embodiments, the method also includes transferring inhibit information from the set of cache latches to the first set of data latches after the discarding the upper page, and inhibiting the plurality of memory cells from further programming when the inhibit information comprises logic "1."

In some embodiments, the method also includes, prior to discarding the upper page, programming the first group of logic states for the plurality of memory cells, wherein the first group of logic states comprises the first, second, third and fourth logic states. The method further includes programming the plurality of memory cells to the fifth, sixth and seventh logic states according to the middle page and the lower page of the first programming data.

In some embodiments, the method also includes recovering the upper page of the first programming data when a programming failure occurs. The method further includes reading the plurality of memory cells by using a first read reference voltage, wherein the first read reference voltage separates the 8 logic states into two distinguishable groups. The method also includes constructing binary codes for the upper page based on the middle page, the lower page and the two distinguishable groups.

In some embodiments, the method also includes discarding the lower page of the first programming data from the third set of data latches in the plurality of page buffers when a third group of logic states are programmed and verified for the plurality of memory cells. The method further includes transferring the lower page of the second programming data from the set of cache latches to the third set of data latches after the discarding the lower page of the first programming data, and uploading a middle page of the second programming data to the set of cache latches. The method also includes discarding 3rd-bit-line information from a set of control latches in the plurality of page buffers when the sixth logic state is programmed and verified for the plurality of memory cells, and uploading an upper page of the second programming data to the set of control latches.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 4 illustrates a mapping scheme of logic pages and the states of a NAND flash memory, according to some embodiments of the present disclosure.

FIG. 6 illustrates an exemplary cache usage of a page buffer, according to some embodiments of the present disclosure.

FIG. 9 illustrates an exemplary cache usage of a page buffer, according to some embodiments of the present disclosure.

FIG. 12 illustrates a mapping and recovery scheme of logic pages, according to some embodiments of the present disclosure.

FIG. 13 illustrates an exemplary cache usage of a page buffer, according to some embodiments of the present disclosure.

FIG. 15 illustrate an exemplary cache usage of the page buffer, according to some embodiments of the present disclosure.

Figure 1:
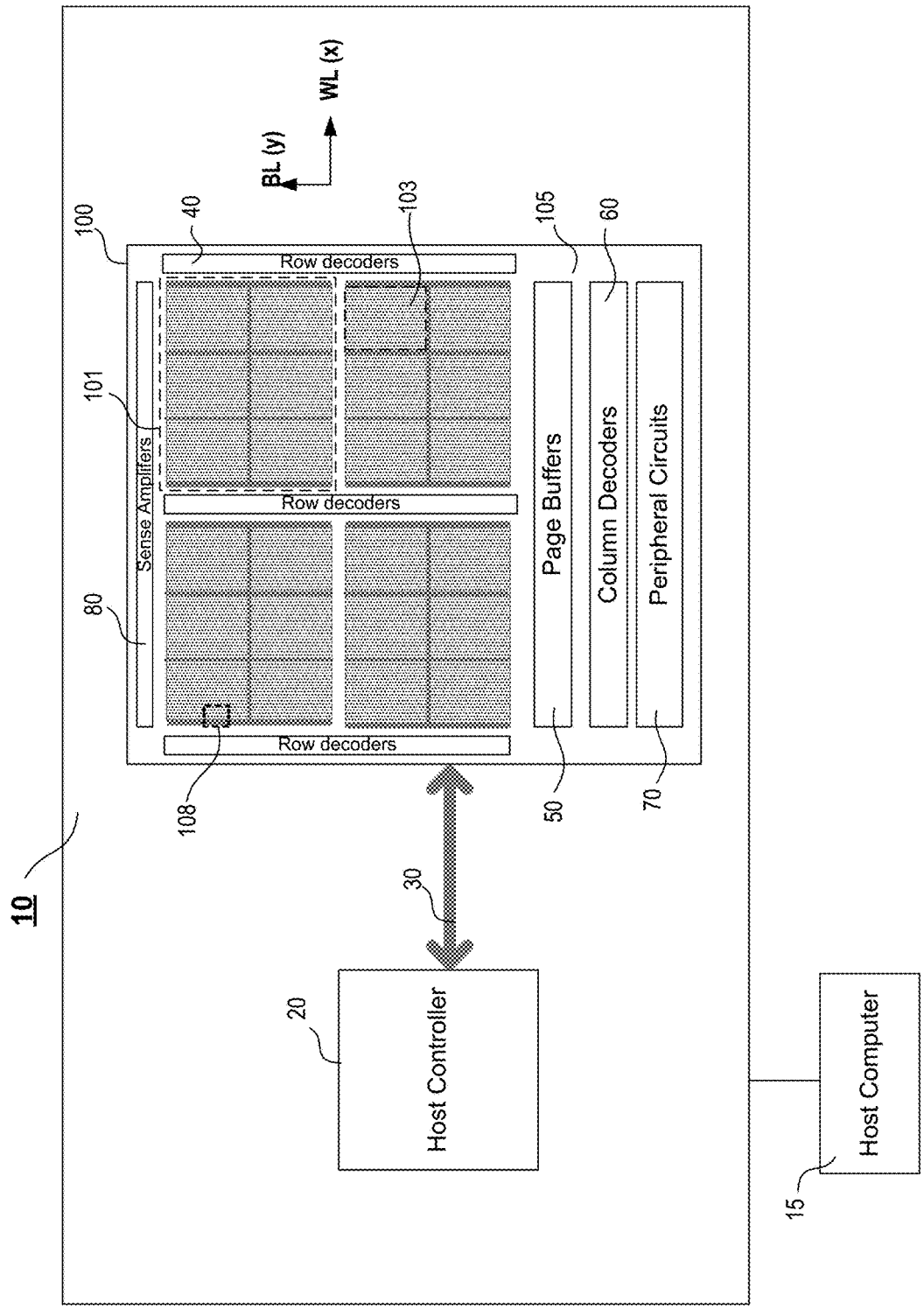
FIG. 1 illustrates a storage system with a NAND flash memory, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1 illustrates a storage system 10, according to some embodiments of the present disclosure. The storage system 10 can include a solid state drive (SSD), which includes a NAND flash memory 100 and a host controller 20. The SSD 10 can communicate with a host computer 15 through the host controller 20, where the host controller 20 can be connected to the NAND flash memory 100 via a memory channel 30. In some embodiments, the SSD 10 can have more than one NAND flash memory 100, while each NAND flash memory 100 can be managed by the host controller 20.

The host computer 15 sends data to be stored at the SSD 10 or retrieves data by reading the SSD 10. The host controller 20 can handle I/O requests received from the host computer 15, ensure data integrity and efficient storage, and manage the NAND flash memory 100. The memory channel 30 can provide data and control communication between the host controller 20 and the NAND flash memory 100 via a data bus.

The NAND flash memory 100 (i.e., "flash," "NAND flash" or "NAND") can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, the memory block 103 is also referred to as the "memory array" or "array." The memory array is the core area in a memory device, performing storage functions.

The NAND flash memory 100 also includes a periphery region 105, an area surrounding memory planes 101. The periphery region 105 contains many digital, analog, and/or mixed-signal circuits to support functions of the memory array, for example, page buffers 50, row decoders 40, column decoders 60, peripheral circuits 70 and sense amplifiers 80. Peripheral circuits 70 include active and/or passive semiconductor devices, such as transistors, diodes, capacitors, resistors, etc., as would be apparent to a person of ordinary skill in the art.

It is noted that the layout of the electronic components in the SSD 10 and the NAND flash memory 100 in FIG. 1 are shown as an example. The SSD 10 and the NAND flash memory 100 can have other layout and can include additional components. For example, The NAND flash memory 100 can also have high-voltage charge pumps, I/O circuits, etc. The SSD 10 can also include firmware, data scrambler, etc.

Figure 2:
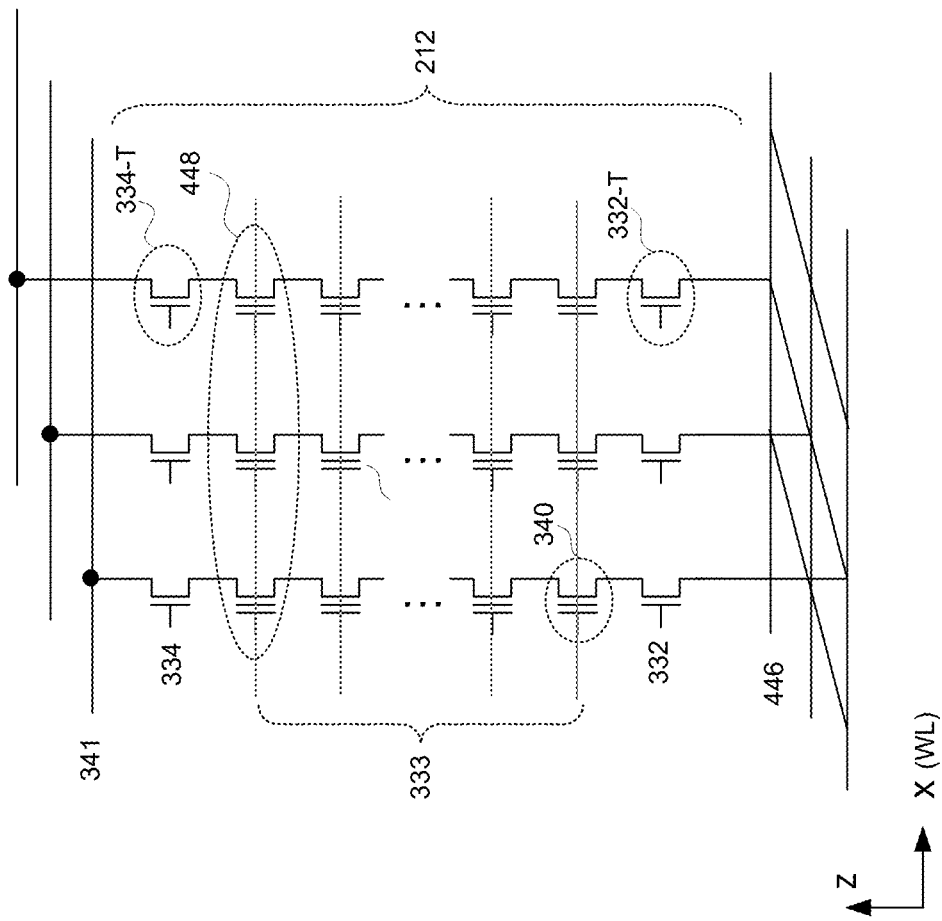
FIG. 2 shows a schematic circuit diagram of a memory array, according to some embodiments of the present disclosure.

FIG. 2 shows a schematic circuit diagram of the memory array 103, according to some embodiments of the present disclosure. The memory array 103 includes a plurality of memory strings 212, each memory string 212 having a plurality of memory cells 340. The memory string 212 also includes at least one field effect transistor (e.g., MOSFET) at each end, which is controlled by a lower select gate (LSG) 332 and a top select gate (TSG) 334, respectively. And the two respective transistors are referred to as lower and top select transistors 332-T and 334-T. The memory cell 340 can be controlled by a control gate 333, where the control gate 333 can be connected to the word line of the memory array 103. The drain terminal of the top select transistor 334-T can be connected to the bit line 341, and the source terminal of the lower select transistor 332-T can be connected an array common source (ACS) 446. The array common source 446 can be shared by the memory strings 212 in an entire memory block, and is also referred to as the common source line.

In some embodiments, the memory array 103 can be formed based on the floating gate technology. In some embodiments, the memory array 103 can be formed based on charge trapping technology. The NAND flash memory based on charge trapping can provide high storage density and high intrinsic reliability. Storage data or logic states (e.g., threshold voltage $V_{th}$ of the memory cell 340) depends on the amount of charge trapped in a storage layer. In some embodiments, the NAND flash memory 100 can be a three-dimensional (3D) memory device, and the memory array 103 can be a 3D memory array, where the memory cells 340 can be vertically stacked on top of each other. The structure and operation of a 3D flash memory is disclosed in U.S. patent application Publication Ser. No. 16/729,838, the entire disclosure of which is incorporated herein by reference.

In a NAND flash memory, read and write operations can be performed in a memory page 448, which includes all memory cells 340 sharing the same word line. In a NAND memory, the memory cell 340 can be in an erased state ER or a programmed state P1. Initially, all memory cells 340 in the memory array 103 can be reset to the erased state ER as logic "1" by implementing a negative voltage difference between the control gates 333 and source terminals of the memory cells (e.g., the array common source 446) such that all the trapped electronic charges in the storage layer of the memory cells 340 can be removed. For example, the negative voltage difference can be induced by setting the control gates 333 of the memory cells 340 to ground, and applying a high positive voltage to the array common source 446. At the erased state ER ("state ER"), the threshold voltage $V_{th}$ of the memory cells 340 can be reset to the lowest value, and can be measured or sensed at the bit line 341.

During programming (i.e., writing), a programming voltage $V_{pgm}$ (e.g., a positive voltage pulse between 10 V and 20 V) can be applied on the control gate 333 such that electronic charges (e.g., electrons) can be injected into the storage layer of the memory cell 340, and thereby increase the threshold voltage $V_{th}$ of the memory cell 340. Thus the memory cell 340 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Figure 3:
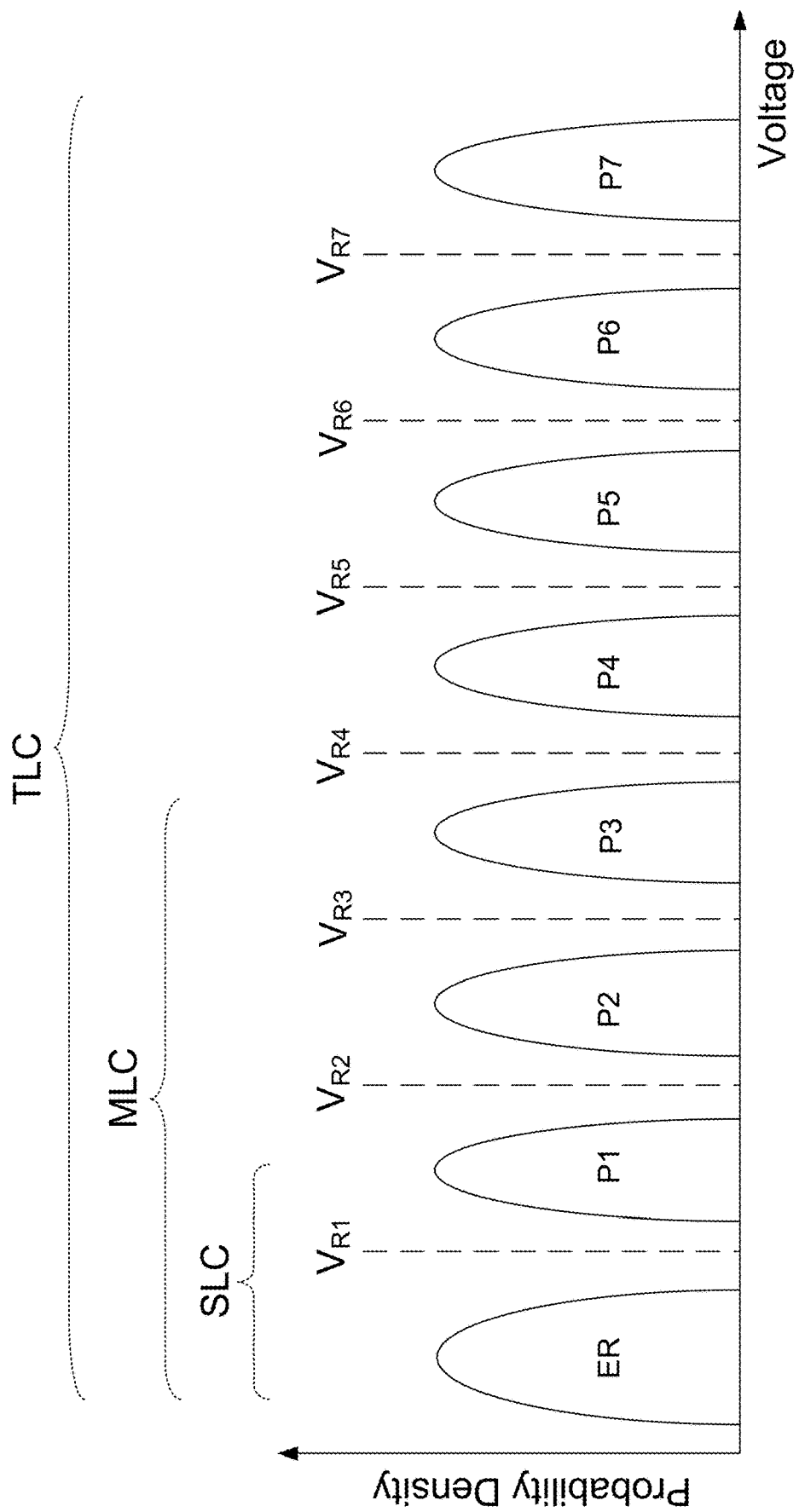
FIG. 3 illustrates a threshold voltage $V_{th}$ distribution of a NAND flash memory, according to some embodiments of the present disclosure.

FIG. 3 illustrates a threshold voltage $V_{th}$ distribution of a NAND flash memory programmed in the triple-level cell (TLC) mode, according to some embodiments of the present disclosure. Due to various variations, each state of the memory cells includes a range of threshold voltages $V_{th}$, where the threshold voltage $V_{th}$ distribution of each state can be represented by a probability density. In some embodiments, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some embodiments, to increase the programming speed, memory cells in the same memory page 448 (FIG. 2) shared with the same word line (e.g., same control gates 333) can be programmed simultaneously. After each ISPP pulse, a verify read can be performed. In some embodiments, the memory cells which have reached a target state (i.e., a target threshold voltage) can be inhibited from further programming by controlling the TSG 334 and/or LSG 332. In some embodiments, memory cells can also be inhibited from further programming by raising the voltage on the corresponding bit lines.

After programming, the eight TLC states ER and P1-P7 can be verified by using one or more read reference voltages VR1-VR7. By applying one or more of the read reference voltages VR1-VR7 to the control gate of a target memory cell, the range of the memory cell's threshold voltage $V_{th}$ can be determined. For example, to verify if a target memory cell 340 is at state ER, the read reference voltage VR1 can be used. If the target memory cell is at state ER, the threshold voltage $V_{th}$ of the target memory cell is lower than the read reference voltage VR1. The target memory cell can be switch on and form a conductive path in the channel. If the target memory cell is at any one of the states P1-P7, the threshold voltage $V_{th}$ of the target memory cell is higher than the read reference voltage VR1. The target memory cell is thereby switched off. By measuring or sensing the current through the target memory cell at the corresponding bit line, the threshold voltage $V_{th}$ or the state of the target memory cell can be verified.

As described above, to determine the two states ER and P1 stored in the SLC mode, only the read reference voltage VR1 is needed. To determine the four states ER and P1-P3 in the MLC mode, the read reference voltages VR1, VR2 and VR3 can be used. To determine the eight states ER and P1-P7 for the TLC mode, the read reference voltages VR1-VR7 can be used. For example, in the TLC mode, the threshold voltage of state ER is below VR1, and the threshold voltage of state P7 is above VR7, where the threshold voltages of state P1 is between VR1 and VR2. States P2-P6 can be determined similarly.

In some embodiments, to improve reading and programming speed, multiple memory pages ("physical pages") can be read or programmed simultaneously. In MLC, TLC or QLC mode, each memory page can be read or programmed based on one or more logic pages. For example, in the TLC mode of 3 bits per memory cell, a memory page can be programmed based on 3 logic pages, e.g., a lower page, a middle page and an upper page.

FIG. 4 illustrates a mapping scheme of logic pages and the states of a NAND flash memory, according to some embodiments of the present disclosure. In this example, the eight states ER and P1-P7 of the TLC mode can be mapped into binary codes (111), (000), (001), (010), (100), (011), (101) and (110), respectively. The 3 bits of the binary codes can be named as a most significant bit (MSB), a center significant bit (CSB), and a least significant bit (LSB), reading from left to right. For example, the state P5 can be mapped to the binary code (011), where the MSB, CSB and LSB are "0," "1," and "1," respectively. In some embodiments, the memory cells in the same memory page can be read or programmed simultaneously. Therefore, each memory page of TLC mode can be programmed by using programming data from 3 logic pages, i.e., the lower page, the middle page and the upper page, corresponding to the LSB, CSB and MSB of the binary codes, respectively. Each memory cells in the memory page can be programmed to a target logic state ("state") according to the binary codes received in the logic pages. During programming, the logic pages of programming data can be stored in the page buffers 50 (FIG. 1) before sending to the memory page of the NAND flash memory 100.

It is noted that the mapping scheme of FIG. 4 may not be the traditional mapping scheme of the logic pages where states can be verified with minimum steps. The mapping scheme shown in FIG. 4 can be generated after data pre-processing such that the total number of page buffer operations is reduced and thereby the overall programming performance of the NAND flash memory can be improved. It is noted that the scope of the present disclosure is not limited to the mapping scheme illustrated in FIG. 4. The method disclosed herein can be applied to a different set of binary codes associated with the states ER and P1-P7. The method can also be applied to a different programming mode, for example, SLC, MLC and/or QLC.

Figure 5:
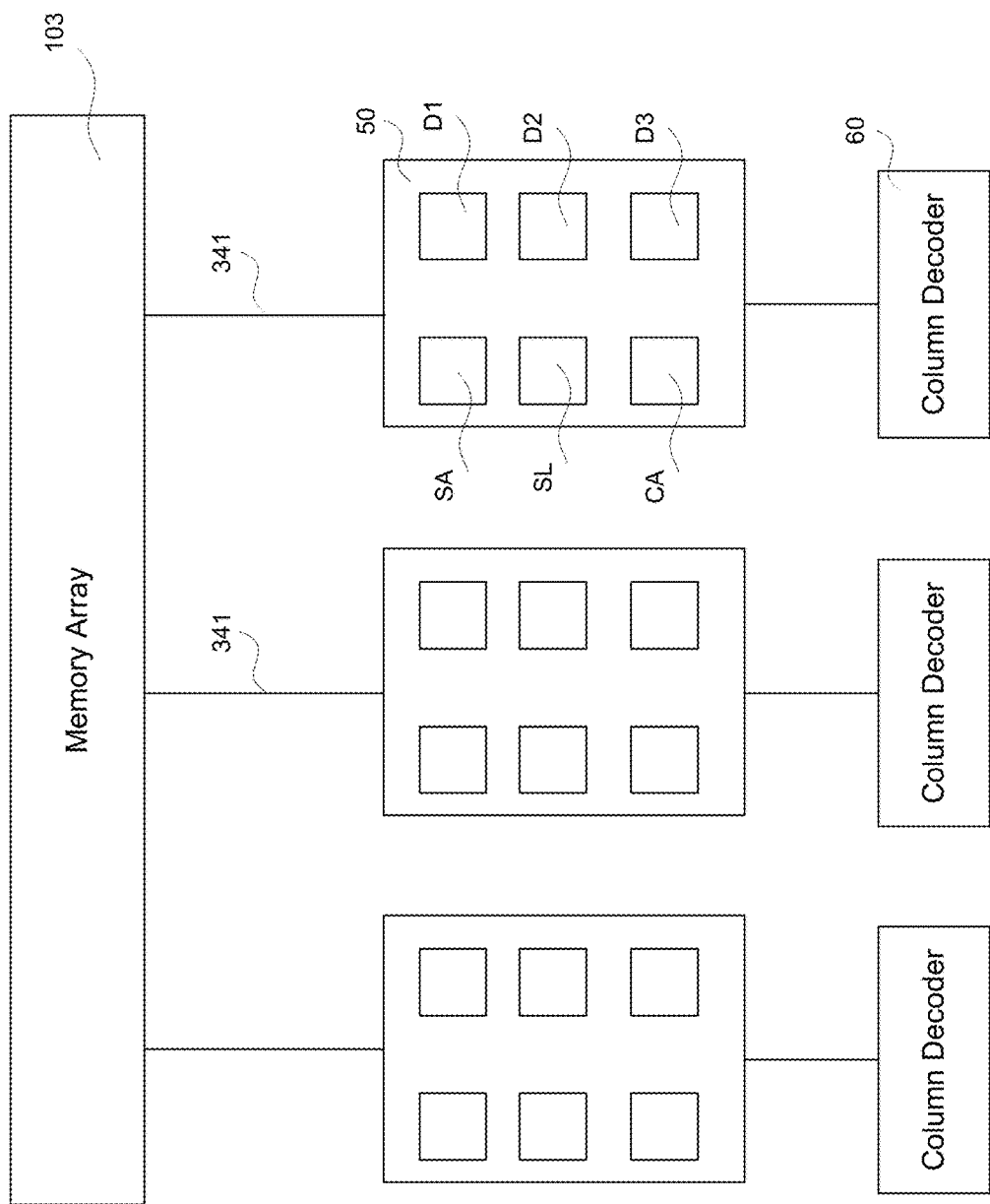
FIG. 5 illustrates a block diagram of page buffers, according to some embodiments of the present disclosure.

FIG. 5 illustrates a block diagram of the page buffers 50 for the NAND flash memory 100 in FIG. 1, according to some embodiments of the present disclosure. In this example, each page buffer 50 can be coupled to one bit line 341 of the memory array 103. In some embodiments, each page buffer 50 can be coupled to two bit lines. Referring to FIG. 2, each memory string 212 is coupled with a bit line 341. Accordingly, the memory cells 340 on the memory string 212 can be coupled with at least one page buffer 50. The memory cells 240 of the memory page 448 can be coupled with a plurality of page buffers 50 through corresponding bit lines 341. The page buffer 50 can temporarily store data for the memory cells in the memory array 103, and then outputs the stored data, for example, to a column decoder 60. The page buffer 50 can also receive data and then provides the received data to the memory cells.

In some embodiments, each page buffer 50 can include one or more latches. In one example, the page buffer 50 can include six latches: latches D1-D3, latch SA, latch SL and cache latch CA. Each of the six latches can include two inverters made by, for example, complementary MOSFETs (i.e., CMOS) devices. Each latch can store 1 bit.

FIG. 6 illustrates an exemplary cache usage of the page buffer 50, according to some embodiments of the present disclosure. In this example, the latches D1-D3 can be used to store the binary codes or programming data that represent the states of the memory cells, and therefore are also referred to data latches. For example, the lower page, middle page and the upper page for the TLC mode in FIG. 4 can be stored in the latches D1-D3, respectively. In some embodiments, the cache latch CA stores inhibit information to control whether the memory cell is inhibited for programming. In some embodiments, the latch SA can store the data measured (or sensed) at the bit line from the sense amplifier, and is also referred to as sensing latch. Latch SL (also referred to as control latch) can store $3^{rd}$-bit-line information to facilitate the programming operation, for example, a high voltage that can be applied on an inhibited bit line, a low voltage on a bit line undergoing programming operation and a medium voltage on a third bit line.

Referring to FIGS. 3-5, in some embodiments, the page buffer 50 can include more data latches or control latches. For example, to program QLC mode, the page buffer can include a latch DX in additional to latches D1-D3 for a total of 4 data latches.

In some embodiments, each memory cell can have $2^n$ logic states and can store n bits. The programming data can include n logic pages to program a plurality of memory cells in the same memory page. In this example, each page buffer can include n data latches to store n bits.

In some embodiments, the n logic pages of programming data are sent to the plurality of memory cells of the same memory page at the same time for the programming operation. During the programming operation, the n logic pages of programming data can be stored in the corresponding n data latches of the page buffers.

Referring to FIG. 1, during a programming (writing) operation, the host computer 15 does not usually store the programming data after sending it to the NAND flash memory 100. To prevent data loss in event of program status failure, the NAND flash memory 100 typically stores the original programming data in the page buffers 50 throughout the entire programming (i.e., write) operation. For example, when a plurality of memory cells of the same memory page are programmed, the n logic pages of programming data can be stored in the corresponding n data latches of the page buffers until all the target states have been successfully programmed and verified for the plurality of memory cells of the same memory page. In case of programming failure, the n logic pages of programming data can be resent to the plurality of memory cells of the same memory page. In the other words, in case of programming failure, the original programming data can be recovered. New programming data can be sent to the page buffer after the previous programming operation is completed and the programmed data in the memory cells are verified.

However, the duration of the entire programming and verification operation can increase significantly for a NAND flash memory programmed in MLC, TLC or QLC mode. To improve programming speed for the SSD 10, it is necessary to improve the cache programming in the page buffer.

For example, the original programming data do not need to be stored in the latches of the page buffer during the entire write operation, and can be discarded gradually. In some embodiments, after some lower states are programmed successfully, one or more logic pages can be vacated. If the write operation fails, the original programming data stored in the one or more logic pages can be recovered nevertheless.

In one example, in TLC mode, when the states P1-P4 are successfully programmed, the upper page data stored in the latch D3 can be discarded, as described in detail below.

Figure 7:
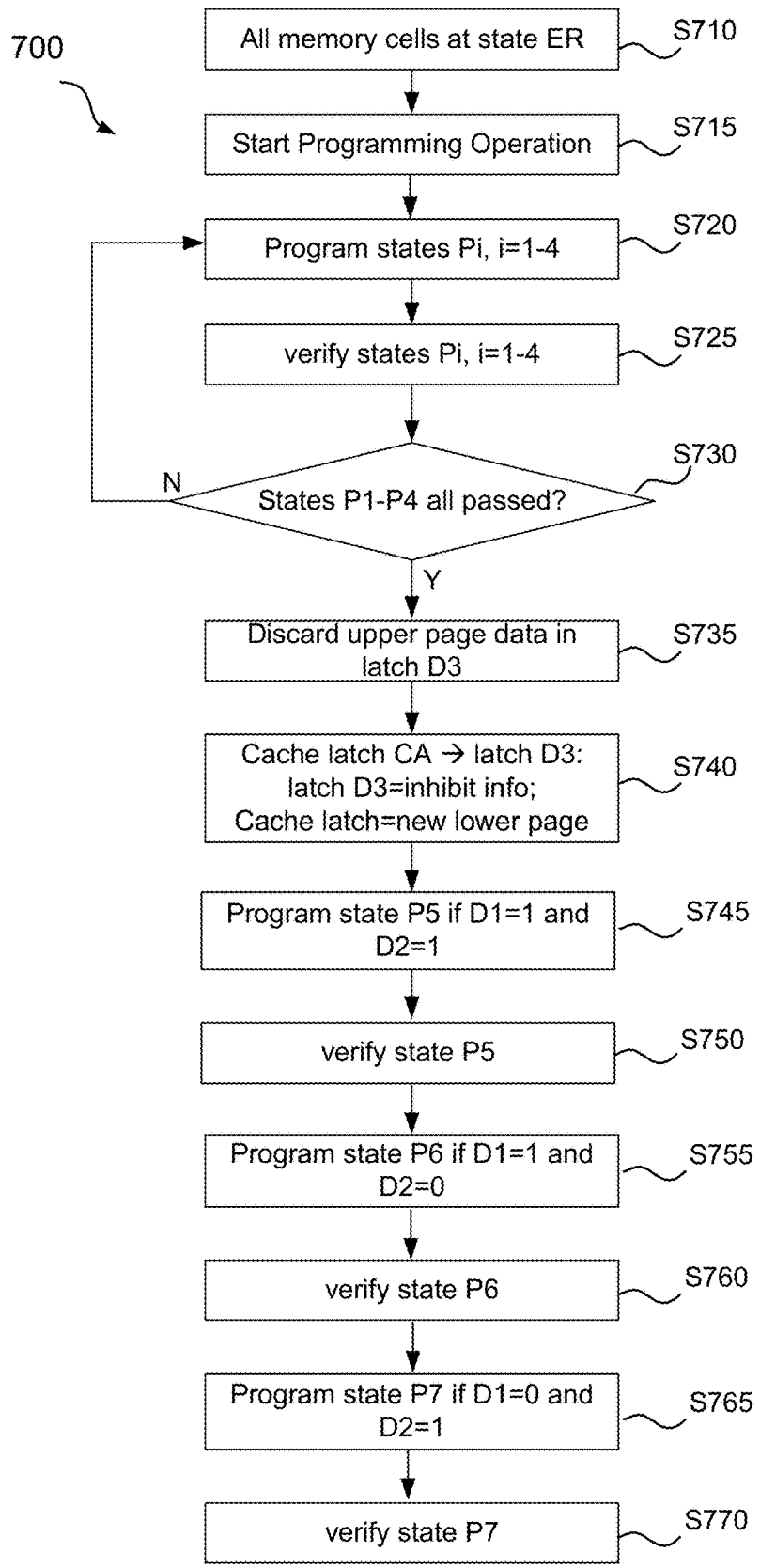
FIG. 7 illustrates a flow diagram of a method of cache programing for a NAND flash memory, according to some embodiments of the present disclosure.

FIG. 7 illustrates a flow diagram of a method 700 for cache programing for a NAND flash memory, according to some embodiments of the present disclosure. It should be understood that the method 700 are not exhaustive and that other operation steps can be performed as well before, after, or between any of the illustrated operation steps. In some embodiments, some operation steps of method 700 can be omitted or other operation steps can be included, which are not described here for simplicity. In some embodiments, operation steps of method 700 can be performed in a different order and/or vary.

The method 700 starts at operation step S710, where all the memory cells in the memory array are at the erased state ER with the lowest threshold voltages $V_{th}$.

Next, at operation step S715, a programming operation is started to program the memory cells in the same memory page in the TLC mode, for example. In some embodiments, the eight TLC states can be programmed and verified sequentially from a low state (e.g., state P1) to a high state (e.g., state P7), where the MSB, CSB and LSB of the binary codes for the TLC mode are mapped to the logic page of upper page, middle page and lower page, and stored in the latches of D3, D2 and D1 in the page buffer 50 (see FIGS. 2-4).

At operation step S720, lower states P1-P4 are programmed sequentially to the memory cells and the states (or threshold voltages $V_{th}$) are verified at operation step S725 accordingly.

At operation step S730, it is checked if all the states P1-P4 have been programmed successfully (i.e., passed). If not, then the method 700 can be routed back to the operation step S720 to continue programming the target state.

Figure 8:
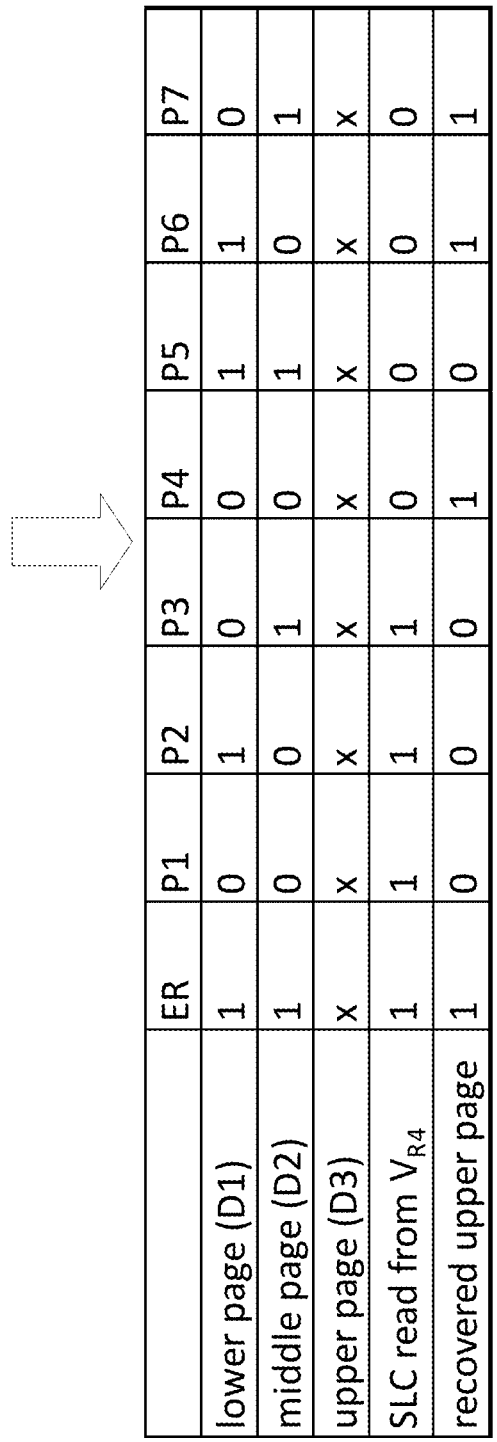
FIG. 8 illustrates a mapping and recovery scheme of logic pages, according to some embodiments of the present disclosure.

If all the states P1-P4 have been programmed successfully, operation step S735 can be performed, where the upper page of the programming data can be discarded and the latch D3 can be vacated. Referring to FIGS. 4 and 8, if all the states P1-P4 are successfully programmed, the remaining states P5-P7 have distinguished binary codes and can be determined based only from lower page and middle page. For example, state P5 corresponds to a binary code (11), where both the middle page and lower page bits are "1"s. State P6 corresponds to a binary code (01), where the middle page and lower page bits are "0" and "1," respectively. State P7 corresponds to a binary code (10), where the middle page and lower page bits are "1" and "0," respectively. Therefore, these three states P5, P6 and P7 can be determined without relying on the upper page data. Thus, the upper page can be removed from the latch D3. Accordingly, the vacated latch D3 can be used for other storage purpose while the programming of higher states P5-P7 continues.

At operation step S740, for example, original data (e.g., inhibit information in FIG. 6) in the cache latch CA can be transferred to the vacated latch D3. In the meantime, a lower page of a new programming data ("new lower page") can be loaded to the cache latch CA. The new cache usage of the page buffer is illustrated in FIG. 9.

At operation step S745, state P5 can be programmed if the lower page and middle page of the programming data stored in the respective latch D1 and D2 are both "1"s. The programmed state P5 can then be verified at operation step S750.

If the lower page and middle page are "1" and "0," respectively, state P6 can be programmed at operation step S755. The programmed state P6 can be verified at operation step S760.

If the lower page and middle page are "0" and "1," respectively, state P7 can be programmed at operation step S765. The programmed state P7 can be verified at operations step S770.

If there is a programming failure, for example, detected at the operation step S750, S760 or S770, the original programming data (i.e., upper page) stored in the latch D3 can be recovered.

Figure 10:
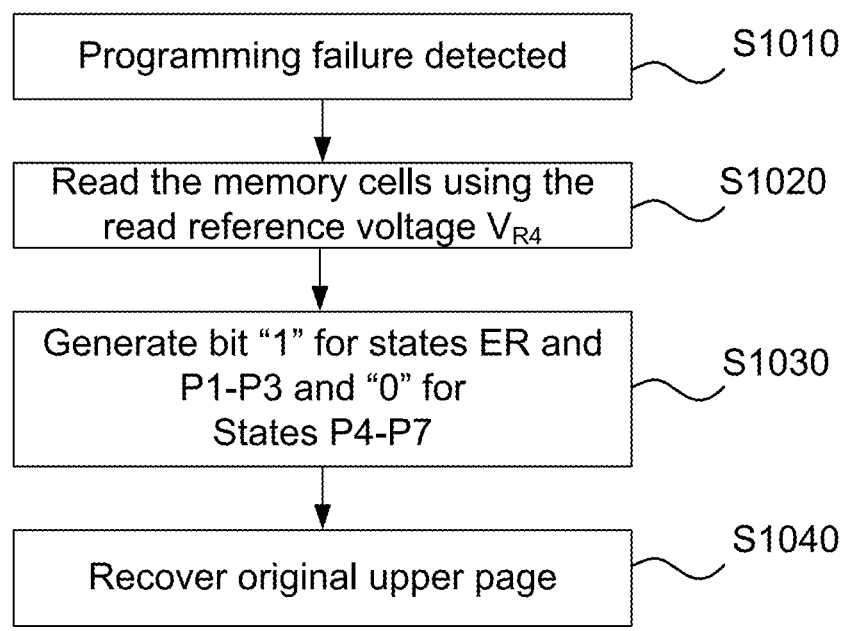
FIG. 10 illustrate a recovering method for a latch in a page buffer, according to some embodiments of the present disclosure.

FIG. 10 illustrate a recovering method 1000 for the latch D3, according to some embodiments of the present disclosure. It should be understood that the recovering method 1000 are not exhaustive and that other operation steps can be performed as well before, after, or between any of the illustrated operation steps. In some embodiments, some operation steps of the recovering method 1000 can be omitted or other operation steps can be included, which are not described here for simplicity. In some embodiments, operation steps of the recovering method 1000 can be performed in a different order and/or vary.

The recovering method 1000 starts at operation step S1010, where a programming failure is detected during the programming of states P5-P7, where a failure flag can be received from the operation step S750, S760 or S770 in FIG. 7.

At operation S1020, the read reference voltage VR4 can be used to perform a read operation on the memory cells. Referring to FIG. 3, states ER and P1-P3 have threshold voltages $V_{th}$ lower than the read reference voltage VR4 and the states P4-P7 have threshold voltages $V_{th}$ higher than the read reference voltage VR4. Therefore, the states ER and P1-P3 can be separated from the states P4-P7 by, for example, sensing current at the corresponding bit line.

At operation step 1030, a bit of "1" can be constructed for the states ER and P1-P3, and a bit of "0" can be constructed for the states P4-P5. In some embodiment, the constructed single bit (referred to as a "SLC read") can be stored in the latch SA coupled to the memory cell of the corresponding state. The SLC read is also illustrated in FIG. 8.

At operation step 1040, the original upper page stored in the latch D3 can be recovered for all the eight TLC states ER and P1-P7. As previously discussed, the states ER and P1-P3 can be separated from the states P4-P7 based on the SLC read. Each state within the two groups can be determined and distinguished solely based on the data in the lower page and the middle page. For example, in the group of states P4-P7, the lower page and middle page for state P4 are both "0"s, and are both "1"s for state P5. The lower page and middle page for state P6 are "1" and "0," respectively. The lower page and middle page for state P6 are "0" and "1," respectively. Therefore, the upper page for states P4-P7 can be determined and recovered according to the pre-determined mapping scheme in FIG. 4. Similarly, the upper page data for states ER and P1-P3 can also be recovered according to the pre-determined mapping scheme in FIG. 4. For example, the lower page and middle page for state ER are both "1"s, and are both "0"s for state P1. The lower page and middle page for state P2 are "1" and "0," respectively. The lower page and middle page for state P3 are "0" and "1," respectively. The constructed upper page is shown in FIG. 8. Compared with FIG. 4, the original programming data in upper page is therefore recovered.

In another example, when the states P1-P6 are successfully programmed, the lower page data stored in the latch D1 can also be discarded, as described in detail below.

Figure 11:
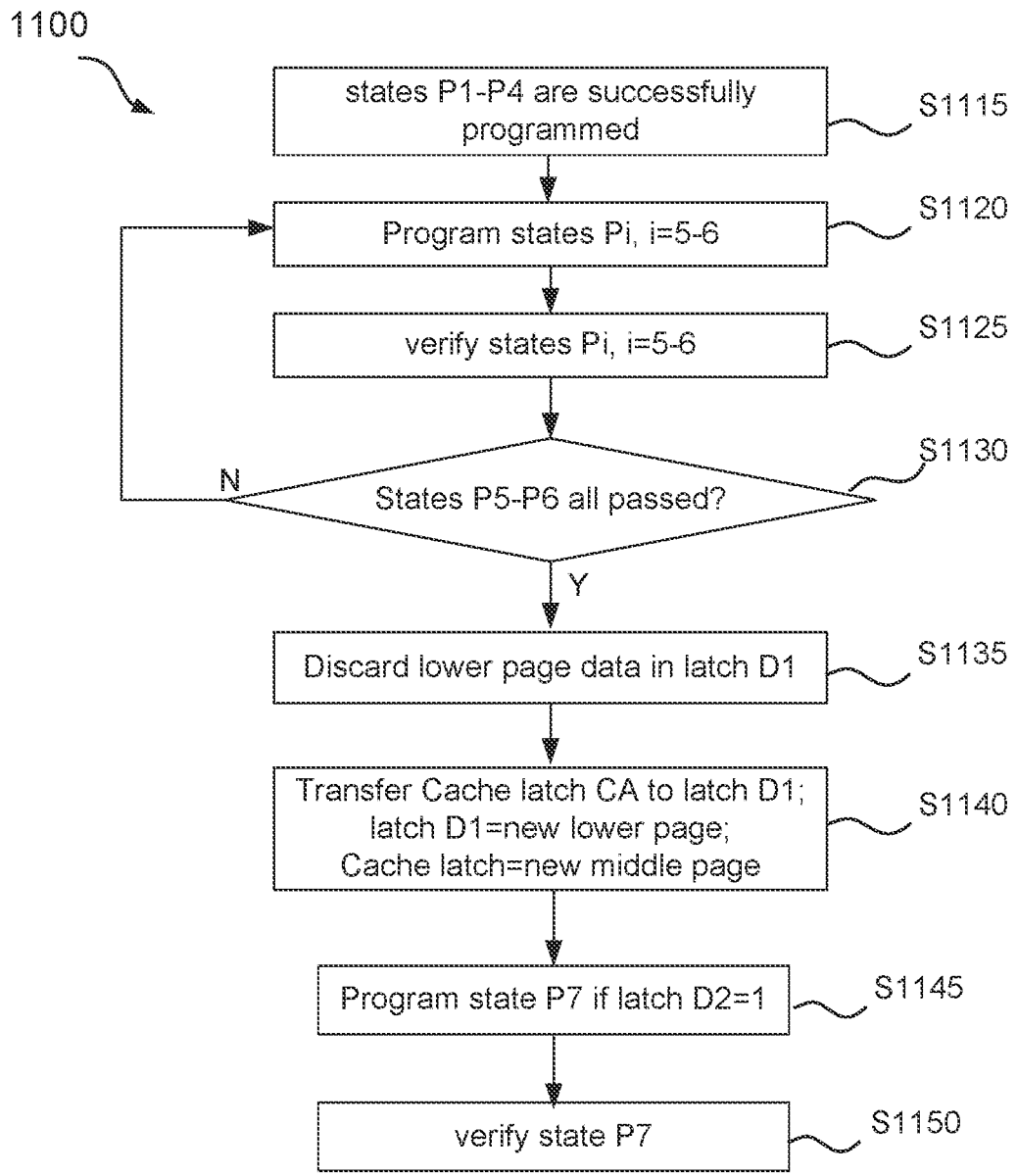
FIG. 11 illustrates a flow diagram of a method for cache programing for a NAND flash memory, according to some embodiments of the present disclosure.

FIG. 11 illustrates a flow diagram of a method 1100 for cache programing for a NAND flash memory, according to some embodiments of the present disclosure. It should be understood that the method 1100 are not exhaustive and that other operation steps can be performed as well before, after, or between any of the illustrated operation steps. In some embodiments, some operation steps of method 1100 can be omitted or other operation steps can be included, which are not described here for simplicity. In some embodiments, operation steps of method 1100 can be performed in a different order and/or vary.

The method 1100 starts at operation step S1115, where the states P1-P4 have been successfully programmed and cache programming is optimized according to method 700 discussed previously.

At operation step S1120, states P5-P6 are programmed sequentially to the memory cells and the states (or threshold voltages $V_{th}$) are verified at operation step S1125 accordingly.

At operation step S1130, it is checked if the states P5-P6 have been programmed successfully (i.e., passed). If not, then the method 1100 can be routed back to the operation step S1120 to continue programming the target state.

If the states P5-P6 have been programmed successfully, i.e., all the states P1-P6 are passed verification, operation step S1135 can be performed, where the lower page of the programming data can be discarded and the latch D1 can be vacated. Referring to FIGS. 4 and 12, if all the states P1-P6 are successfully programmed, the remaining state P7 can be determined solely from the middle page, i.e., the middle page of the state P7 corresponds to logic "1." Thus, the lower page of programming data can be removed from the latch D1. Accordingly, the vacated latch D1 can be used for other storage purpose while programming the state P7.

At operation step S1140, for example, the new lower page stored in the cache latch CA at operation step S740 in FIG. 7, can be transferred to the vacated latch D1. In the meantime, a middle page of the new programming data ("new middle page") can be uploaded to the cache latch CA. The new cache usage of the page buffer is illustrated in FIG. 13.

At operation step S1145, if the middle page stored in the latch D2 is "1", then state P7 can be programmed.

Next, at operation step S1150, the state P7 is verified at the memory cells. If the target state is not reached, operation step S1145 can be repeated. If the target state is reached, the programming operation is completed.

Similar to the recovering method 1000, if there is a programming failure, for example, detected at the operation step S1150, the original programming data, i.e., the lower page and the upper page stored in the respective latch D1 and latch D3 can be recovered.

Figure 14:
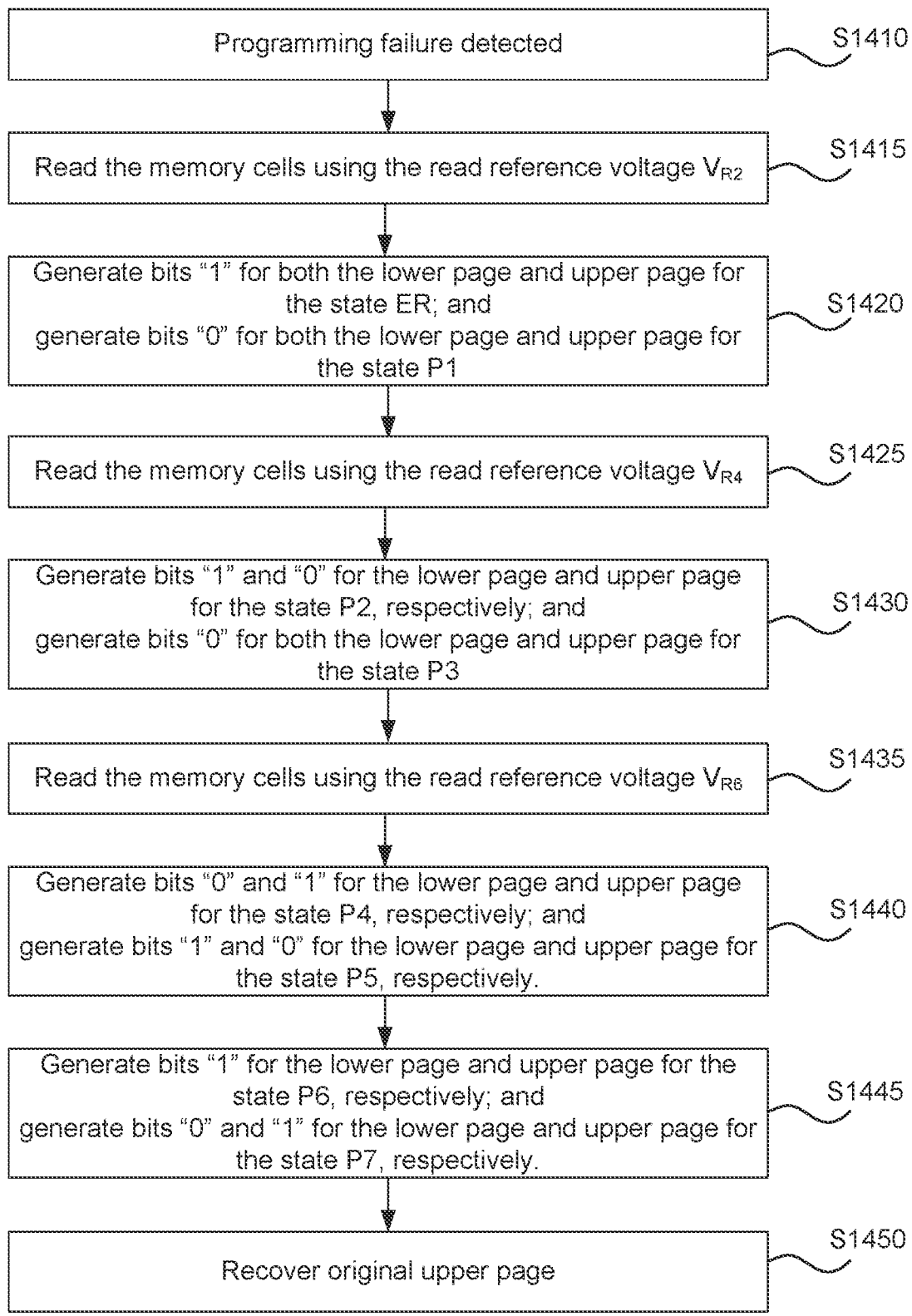
FIG. 14 illustrate a recovering method for latches in a page buffer, according to some embodiments of the present disclosure.

FIG. 14 illustrate a recovering method 1400 for the latch D1 and latch D3, according to some embodiments of the present disclosure. It should be understood that the recovering method 1400 are not exhaustive and that other operation steps can be performed as well before, after, or between any of the illustrated operation steps. In some embodiments, some operation steps of the recovering method 1400 can be omitted or other operation steps can be included, which are not described here for simplicity. In some embodiments, operation steps of the recovering method 1400 can be performed in a different order and/or vary.

The recovering method 1400 starts at operation step S1410, where a programming failure for the state P7 is detected at operation step S1150 in FIG. 11, where a failure flag can be received.

At operation S1415, the read reference voltage VR2 can be used to perform a read operation on the memory cells. Referring to FIG. 3, states ER and P1 have threshold voltages $V_{th}$ lower than the read reference voltage VR2 and the states P2-P7 have threshold voltages $V_{th}$ higher than the read reference voltage VR2. Therefore, the states ER and P1 can be separated from the states P2-P7.

Referring to FIGS. 4 and 12, the states ER and P1 can be determined based on their middle page of programming data, i.e., the middle page stored in latch D2 are "1" and "0" for state ER and P1, respectively. According to the pre-determined mapping scheme in FIG. 4, at operation step 1420, bits "1" can be generated for both the lower page and upper page of the state ER. And bits "0" can be generated for both the lower page and upper page of the state P1.

At operation S1425, the read reference voltage VR4 can be used to perform a read operation on the memory cells. Referring to FIG. 3, states ER and P1-P3 have threshold voltages $V_{th}$ lower than the read reference voltage VR4 and the states P4-P7 have threshold voltages $V_{th}$ higher than the read reference voltage VR4. Therefore, the states ER and P1-P3 can be separated from the states P4-P7. Since the lower page and the upper page of the states ER and P1 have been reconstructed at the previous step, the lower page and the upper page of states P2 and P3 can be recovered.

Referring to FIGS. 4 and 12, the states P2 and P3 can be determined based on their middle page data, i.e., the middle page stored in latch D2 are "0" and "1" for state P2 and P3, respectively. According to the pre-determined mapping scheme in FIG. 4, at operation step 1430, bits "1" and "0" can be generated for the lower page and upper page of the state P2, respectively. Similarly, bits "0" can be generated for both the lower page and upper page of the state P3.

At operation S1435, the read reference voltage VR6 can be used to perform a read operation on the memory cells. Referring to FIG. 3, states ER and P1-P5 have threshold voltages $V_{th}$ lower than the read reference voltage VR6 and the states P6-P7 have threshold voltages $V_{th}$ higher than the read reference voltage VR6. Therefore, the states ER and P1-P5 can be separated from the states P6-P7. Since the lower page and the upper page of the states ER and P1-P3 have been reconstructed at the previous steps, the lower page and the upper page of states P4 and P5 can be recovered.

Referring to FIGS. 4 and 12, the state P4 and the state P5 can be determined based on their middle page data, i.e., the middle page stored in latch D2 are "0" and "1" for state P4 and P5, respectively. According to the pre-determined mapping scheme in FIG. 4, at operation step 1440, bits "0" and "1" can be generated for the lower page and upper page of the state P4, respectively. Similarly, bits "1" and "0" can be generated for the lower page and upper page of the state P5, respectively.

In the meantime, at operation step S1445, the lower page and the upper page of states P6 and P7 can be recovered. Referring to FIGS. 4 and 12, the state P6 and P7 can be determined based on their middle page data, i.e., the middle page stored in latch D2 are "0" and "1" for state P6 and P7, respectively. According to the pre-determined mapping scheme in FIG. 4, at operation step 1445, bits "1" can be generated for both the lower page and upper page of the state P6. Similarly, bits "0" and "1" can be generated for the lower page and upper page of the state P7, respectively.

At operation step 1450, the original lower page and upper page stored in the latch D1 and latch D3 can be fully recovered for all the eight TLC states ER and P1-P7.

FIG. 15 illustrate an exemplary cache usage of the page buffer after the states P1-P6 have been successfully programmed, according to some embodiments of the present disclosure. In this example, the $3^{rd}$ bit line information stored in the latch SL can also be discarded. Accordingly, latch SL can be vacated and ready for loading data for other purpose. In some embodiments, the new middle page stored in the cache latch CA at operation step S1140 discussed previously (FIGS. 11 and 13) can be transferred to the latch SL. An upper page of the new programming data ("new upper page") can be loaded to the cache latch CA.

In some embodiments, the middle page of the original programming data stored in the latch D2 can be discarded after all the states P1-P7 are programmed successfully. The new upper page can be loaded to the page buffer accordingly. For example, the new upper page can be uploaded to the latch D2. In another example, the new upper page can be uploaded to the cache latch CA after the new middle page transferred to the latch D2.

In summary, the present disclosure provides a method of cache programming of a NAND flash memory. The method includes discarding a first logic page of first programming data from a first set of data latches in a plurality of page buffers of the NAND flash memory when a first group of logic states are programmed and verified for a plurality of memory cells in a memory page of the NAND flash memory. Each of the plurality of memory cells comprises $2^n$ logic states. Each of the plurality of memory cells is coupled to at least one of the plurality of page buffers. The plurality of page buffers comprises n set of data latches configured to store n logic pages of programming data. The method also includes uploading a second logic page of second programming data to a set of cache latches in the plurality of page buffers.

The present disclosure also provides a method of cache programming of a NAND flash memory in a triple-level-cell (TLC) mode. The method includes discarding an upper page of a first programming data from a first set of data latches in a plurality of page buffers of the NAND flash memory when a first group of logic states are programmed and verified for a plurality of memory cells in a memory page of the NAND flash memory. Each of the plurality of memory cells has 8 logic states. The 8 logic states can be an erased state and ith logic states, wherein i=1 to 7 and threshold voltages of the 8 logic states are in an ascending order. Each of the plurality of memory cells is coupled to at least one of the plurality of page buffers. The plurality of page buffers comprises the first set of data latches, a second set of data latches and a third set of data latches, configured to store the upper page, a middle page and a lower page of programming data, respectively. The method further includes uploading a lower page of second programming data to a set of cache latches in the plurality of page buffers.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of cache programming of a NAND flash memory, wherein the NAND flash memory comprises a first set of data latches in a plurality of page buffers and a plurality of memory cells in a memory page, the method comprising:
   discarding a first logic page of first programming data from the first set of data latches when a first group of logic states are programmed and verified for the plurality of memory cells, wherein
      each of the plurality of memory cells comprises $2^n$ logic states, wherein n is an integer larger than 1;
      each of the plurality of memory cells is coupled to at least one of the plurality of page buffers; and
      the plurality of page buffers comprises n set of data latches configured to store n logic pages of programming data; and
   uploading a second logic page of second programming data to a set of cache latches in the plurality of page buffers.

2. The method of claim 1, further comprising:
   transferring inhibit information from the set of cache latches to the first set of data latches after the discarding the first logic page.

3. The method of claim 2, further comprising:
   inhibiting the plurality of memory cells from further programming when the inhibit information comprises logic 1.

4. The method of claim 1, further comprising:
   prior to discarding the first logic page, programming the first group of logic states for the plurality of memory cells, wherein the first group of logic states comprise a first group of threshold voltages lower than a second group of threshold voltages of a second group of logic states of the plurality of memory cells.

5. The method of claim 4, further comprising:
   programming the plurality of memory cells to the second group of logic states according to remaining logic pages of the first programming data.

6. The method of claim 1, further comprising:
   verifying each of the 2n logic states of the plurality of memory cells by using a plurality of read reference voltages, each read reference voltage comprising a magnitude between threshold voltages of two adjacent logic states.

7. The method of claim 1, further comprising:
   programming the plurality of memory cells from a first logic state to an nth logic state with threshold voltages in an ascending order.

8. The method of claim 1, further comprising:
   recovering the first logic page of the first programming data when a programming failure occurs.

9. The method of claim 8, further comprising:
   reading the plurality of memory cells by using a first read reference voltage, wherein the first read reference voltage separates the $2^n$ logic states into two distinguishable groups.

10. The method of claim 9, further comprising:
    constructing binary codes for the first logic page based on remaining logic pages and the two distinguishable groups.

11. A method of cache programming of a NAND flash memory in a triple-level-cell (TLC) mode, wherein the NAND flash memory comprises a first set of data latches in a plurality of page buffers and a plurality of memory cells in a memory page, the method comprising:
    discarding an upper page of a first programming data from the first set of data latches when a first group of logic states are programmed and verified for the plurality of memory cells, wherein:
       each of the plurality of memory cells comprises 8 logic states, the 8 logic states comprising an erased state and ith logic states, wherein:
          i=1 to 7; and
          threshold voltages of the 8 logic states are in an ascending order;
       each of the plurality of memory cells is coupled to at least one of the plurality of page buffers; and
       the plurality of page buffers comprise the first set of data latches, a second set of data latches and a third set of data latches, configured to store the upper page, a middle page and a lower page of the first programming data, respectively; and
    uploading a lower page of second programming data to a set of cache latches in the plurality of page buffers.

12. The method of claim 11, further comprising:
    transferring inhibit information from the set of cache latches to the first set of data latches after the discarding the upper page; and
    inhibiting the plurality of memory cells from further programming when the inhibit information comprises logic 1.

13. The method of claim 11, further comprising:
    prior to discarding the upper page, programming the first group of logic states for the plurality of memory cells, wherein the first group of logic states comprises the first, second, third and fourth logic states.

14. The method of claim 13, further comprising:
    programming the plurality of memory cells to the fifth, sixth and seventh logic states according to the middle page and the lower page of the first programming data.

15. The method of claim 11, further comprising:
    recovering the upper page of the first programming data when a programming failure occurs.

16. The method of claim 15, further comprising:
    reading the plurality of memory cells by using a first read reference voltage, wherein the first read reference voltage separates the 8 logic states into two distinguishable groups.

17. The method of claim 16, further comprising:
    constructing binary codes for the upper page based on the middle page and the lower page of the first programming data and the two distinguishable groups.

18. The method of claim 11, further comprising:
    programming the plurality of memory cells to the fifth and the sixth logic states;
    verifying the fifth and the sixth logic states in the plurality of memory cells; and
    discarding the lower page of the first programming data from the third set of data latches in the plurality of page buffers.

19. The method of claim 18, further comprising:
    transferring the lower page of the second programming data from the set of cache latches to the third set of data latches after the discarding of the lower page of the first programming data; and
    uploading a middle page of the second programming data to the set of cache latches.

20. The method of claim 19, further comprising:
discarding $3^{rd}$-bit-line information from a set of control latches in the plurality of page buffers after discarding the lower page of the first programming data; and
uploading an upper page of the second programming data to the set of control latches.

* * * * *